(12) United States Patent
Weinraub

(10) Patent No.: US 7,170,277 B2
(45) Date of Patent: Jan. 30, 2007

(54) SHIELD FOR TESTER LOAD BOARDS

(75) Inventor: Chananiel Weinraub, Herzliya (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/103,886

(22) Filed: Apr. 12, 2005

(65) Prior Publication Data
US 2006/0226829 A1 Oct. 12, 2006

(51) Int. Cl.
*G01R 31/28* (2006.01)
(52) U.S. Cl. .................................. 324/158.1
(58) Field of Classification Search ............... 324/765, 324/760, 158.1, 100; 250/515.1; 361/816, 361/752, 800; 174/378, 35
See application file for complete search history.

(56) References Cited
U.S. PATENT DOCUMENTS
5,136,236 A * 8/1992 Bohnert et al. ............... 324/96
5,566,055 A * 10/1996 Salvi, Jr. ..................... 361/816
6,972,967 B2 * 12/2005 Norte et al. ................. 361/818

* cited by examiner

*Primary Examiner*—Ha Tran Nguyen
*Assistant Examiner*—Tung X. Nguyen
(74) *Attorney, Agent, or Firm*—Yingsheng Tung; Wade James Brady, III; Frederick J. Telecky, Jr.

(57) ABSTRACT

The invention provides tester load board shields (10, 40) for attachment to tester load boards. The shields (10, 40) of the invention protect from physical damage and electromagnetic interference. A preferred embodiment of a tester load board shield (10) of the invention is disclosed in which a disc (12) and outer rim (14) of conductive metal such as aluminum or aluminum alloy are configured to accept a tester load board. The tester load board shield (10) has holes (18) to align with a selected tester load board for attachment of the shield (10) thereto. Stanchions (22) are provided to facilitate attachment of the Loadboard with shield (10) to automatic test equipment known in the arts while a tester load board, also familiar in the arts, is fastened to the shield (10). Another embodiment of a tester load board shield (40) is disclosed in the shape of annulus (42) configured to contain a tester load board within an outer rim (44), planar surface (46), and inner rim (50). Vents (28) or ventilation slots (58) are also provided in preferred embodiments of shields (10, 40) of the invention in order to permit the escape of heat.

6 Claims, 3 Drawing Sheets

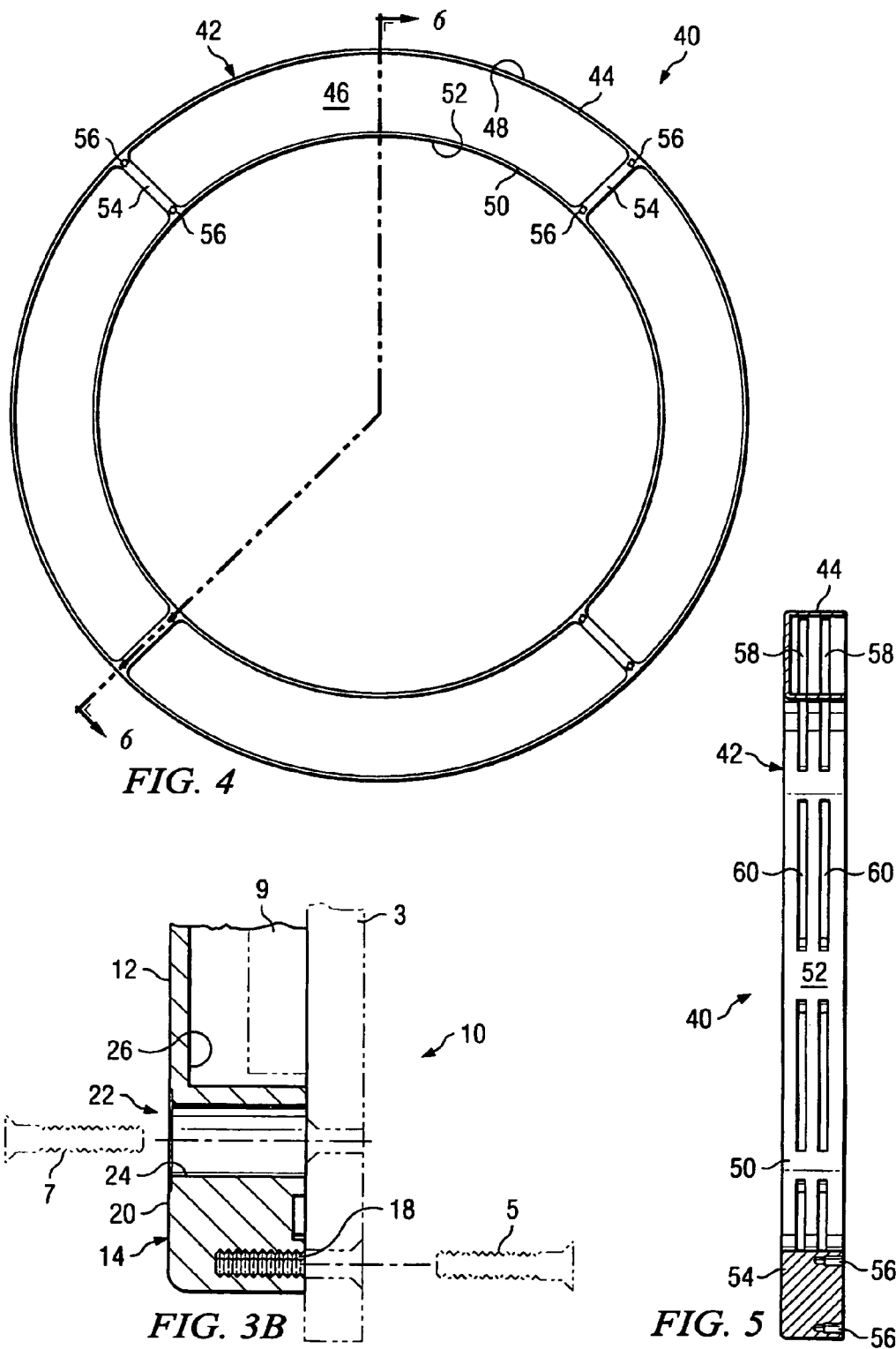

SHIELD FOR TESTER LOAD BOARDS

TECHNICAL FIELD

The invention relates to the manufacture of integrated circuit assemblies. More particularly, the invention relates to IC manufacturing and to the testing of completed IC devices using automatic test equipment. Specifically, the invention relates to shields for protecting test load boards from electromagnetic interference and physical harm.

BACKGROUND OF THE INVENTION

Semiconductor devices such as ICs are often subject to testing. Testing presents many technical challenges in order to adequately verify the operation of the device under test (DUT), and simultaneously to minimize false readings due to the test conditions. Electromagnetic interference is often present in the manufacturing environment, and can result in erroneous test readings. Erroneous readings can lead to the rejection of serviceable devices, or in the failure to detect defective devices. Both problems potentially result in increased costs.

Testing can be a major contributor to the cost of semiconductor device development and manufacturing. Integrated circuits can be tested in various ways. One common test technique is to electrically stimulate one or more ICs on a tester load board, and monitor the electrical response. Typically automated test equipment (ATE) is connected, through the test load board, to external electrical leads on the DUT. The test equipment stimulates the DUT by providing electrical signals to the DUT's input pins and then monitoring the resultant electrical signals provided from the DUT on its output pins. The use of sophisticated and expensive tester load boards necessitates that attention be given to the minimization of damage to the load boards during storage, shipping, and handling, as well as to shielding the load boards from electromagnetic interference during testing.

Load boards used for testing are generally intricate and costly. As the interface between the automatic test equipment (ATE) and the device under test (DUT), the load board typically contains the components required to prepare the DUT for testing, route the test and response signals between the DUT and the ATE, and in some cases to provide additional test capabilities not provided for in the ATE design. There are also load boards designed for the purpose of testing or calibrating the ATE. Load boards are usually customized to a specific device or group of devices. As such, complete, ready-to-use load boards are not normally available off-the-shelf. Accordingly, much design and engineering attention is devoted to designing and fabricating a load board for a particular application. A typical load board has a printed circuit board (PCB) with a test socket for receiving a DUT, as well as an assortment of interconnected components, e.g., ICs, resistors, capacitors, relays, connectors, and so forth, that make up the test circuitry. Load board design takes into consideration many factors such as power supply routing, signal routing, and the avoidance of electrical interference. Electromagnetic interference with, or physical damage to the testing load board can lead to delays and increased expense in the manufacturing process. Due to these and other problems, it would be useful and advantageous to provide improved shielding to tester load boards in order to provide protection from electromagnetic interference and physical damage.

SUMMARY OF THE INVENTION

In carrying out the principles of the present invention, in accordance with preferred embodiments thereof, the invention provides tester load boards with protection from electromagnetic interference during testing and from physical damage during testing, handling, shipping, and storage.

According to one aspect of the invention, a preferred embodiment of a tester load board shield has an annular shape for encircling a tester load board. An outer rim extends perpendicular to the outer edge of a planar surface of the annulus and defines the outer edge of the shield. An inner rim extends from the perpendicular to the inner edge of the planar surface and defines the inner edge of the shield. A number of ribs also extend perpendicular to planar surface, and span radially between the inner rim and outer rim. At least one threaded fastener hole is provided in each of at least two of the ribs, in an arrangement suited for receiving fasteners for attachment of the shield to a tester load board.

According to additional aspects of the invention, preferred embodiments thereof are described having numerous ventilation slots perforating the outer rim, the inner rim, or both.

According to one aspect of the invention, in a preferred embodiment, a tester load board shield includes a disc for shielding a tester load board. The disc preferably has a number of perforating vents. A rim extends perpendicularly from the outer edge of the disc, defining the outer edge of the shield. Threaded fastener holes are included on the lower surface of the rim for attachment of the shield to a tester load board. A number of stanchions extend perpendicular to the lower surface of the disc in an arrangement suitable to facilitate attachment of a shielded tester load board to automatic test equipment.

The invention has advantages including but not limited to reducing electromagnetic interference and protecting load boards from physical harm, providing potential advantages in time, labor, and cost savings in IC manufacturing and testing processes. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 3B illustrates an example of the use of the invention showing the portion of the invention also shown in FIG. 3A associated with a tester load board, screws, and protected components;

FIG. 4 is a bottom view of an example of an alternative embodiment of the invention;

FIG. 5 is a cut-away side view of a portion of the embodiment of the invention shown in FIG. 5.

Figure 1:
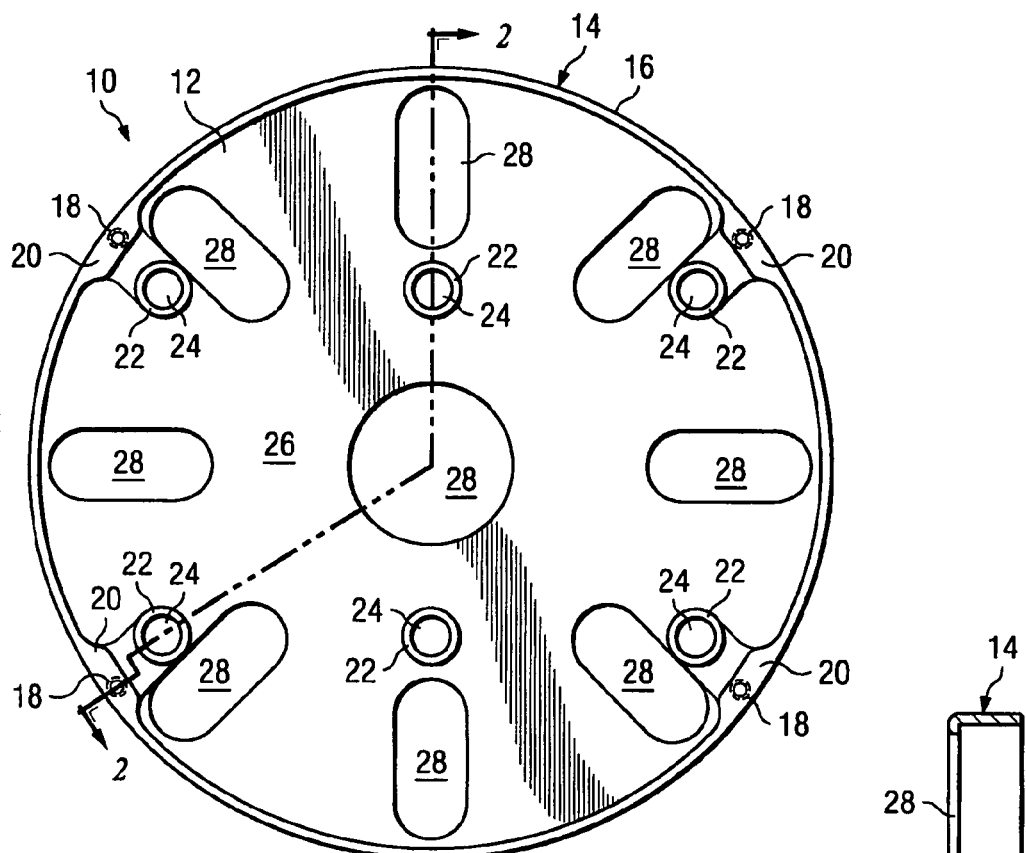
FIG. 1 is a bottom view of an example of a preferred embodiment of the invention.

References in the detailed description correspond to like references in the various drawings unless otherwise noted. Descriptive and directional terms used in the written description such as inner, outer, lower, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

The invention provides tester load board shields in various embodiments for attachment to tester load boards to protect from physical damage and to shield from electromagnetic interference during testing. Referring now primarily to FIGS. 1 through 3B, a preferred embodiment of a tester load board shield 10 of the invention is shown in several views. This particular example is a shield 10 for use with testers familiar in the arts for testers using twelve, fourteen, or sixteen inch diameter printed circuit boards. The embodiment shown is by way of example, and various modifications to accommodate different tester load board arrangements are possible in the art without departure from the invention. For example, the diameter, height, or other aspects of the configurations shown and described may be altered in order to accommodate a particular tester or tester-load board combination. The shield 10 has a disc 12 for substantially covering a tester load board 3. A rim 14 extends from the outer edge 16 of the disc. Preferably, the shield 10 is made from a conductive metal such as aluminum or aluminum alloy. The rim 14 is preferably perpendicular to the plane defined by the disc 10.

As shown in the preferred embodiment of FIGS. 1 through 3B, the tester load board shield 10 has a number of holes 18 for receiving threaded fasteners 5 in the rim 14. In this case, four threaded fastener holes 18 are shown. Of course other arrangements are possible within the scope of the invention. The threaded fastener holes 18 are configured to align with a selected tester load board 3 for attachment of the shield 10 thereto. As shown, widened portions 20 may be provided in the rim 14 in order to accommodate the provision of the fastener holes 18.

Stanchions 22, typically with an open chamber within 24, extend from the lower surface 26 of the disc 12. The stanchions 22 are preferably perpendicular to the plane of the disc 12 and are configured for allowing screws 7 to pass through without interference and attach the shielded tester load board 3 to test equipment (not shown) known in the arts. It should be appreciated that the shield 10 is configured to cover load board circuitry 9 but not necessarily the entire PCB itself. Although six stanchions 22 are shown in the exemplary embodiment, the number and spacing of stanchions is not essential to the practice of the invention, but should be selected based on the tester and load board used.

Figure 2:
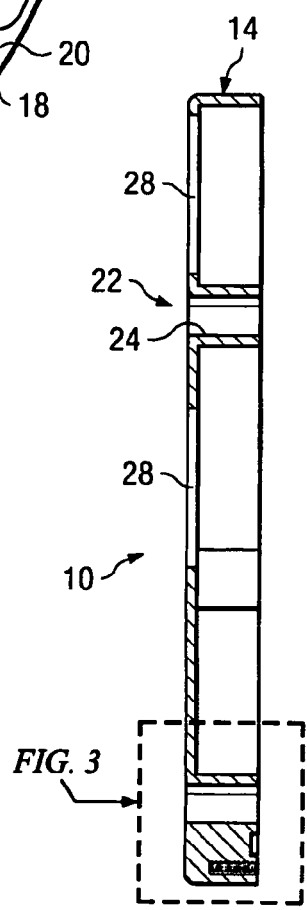
FIG. 2 is a cut-away side view of a portion of the embodiment of the invention shown in FIG. 1.
Figure 3A:
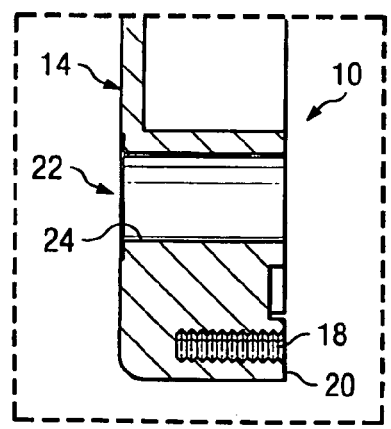
FIG. 3A is a partial cut-away side view showing further detail of a portion of the invention shown in FIGS. 1 and 2.

Further referring to FIGS. 1 and 2, in preferred embodiments of the shield 10, a series of vents 28 perforate the disc 12 in order to permit heat to escape from within the shield 10. Typically eight vents 28 are equally spaced about the surface of the disc 12, but other variations are possible within the scope of the invention. For example, four vents may be used. In the shield 10 shown, an additional vent 28 is also provided at the center of the disc 12.

An additional alternative embodiment of a tester load board shield 40 according to the invention is shown in FIGS. 4 and 5. This embodiment of the shield 40 is in the configuration of an annulus 42 designed to contain a tester load board (not shown), for example, an eighteen inch tester load board known in the arts. An outer rim 44 extends from the outer edge of one planar surface 46 of the annulus 42 defining the outer edge 48 of the shield 40. Preferably, the shield 40 is made from aluminum or aluminum alloy, although other conductive metals may be used. An inner rim 50 extends perpendicularly from the inner edge of the planar surface 46, defining the inner edge 52 of the shield 40.

Preferably at several equally spaced locations dispersed radially about the annulus 42, a number of ribs 54, in this case four, extend perpendicularly from the planar surface 46, spanning between the outer rim 44 and inner rim 50. Holes 56 are provided in the ribs 54 for receiving threaded fasteners for attachment of the shield 40 to a tester load board. In the exemplary embodiment shown, two threaded fastener holes 56 are used at each of the four ribs 54. It will be understood by those reasonably skilled in the arts that other arrangements may be used to accommodate particular testers and load boards.

Now referring to FIG. 5, preferably, ventilation slots 58 perforate the outer rim 44 in order to permit the escape of heat from the shield 40 during use with a tester. Additional ventilation slots 60 may also be provided in the inner rim 50 to permit additional ventilation. The precise number, size, shape, and location of the ventilation slots 58, 60 is not essential to the practice of the invention.

Figure 6:
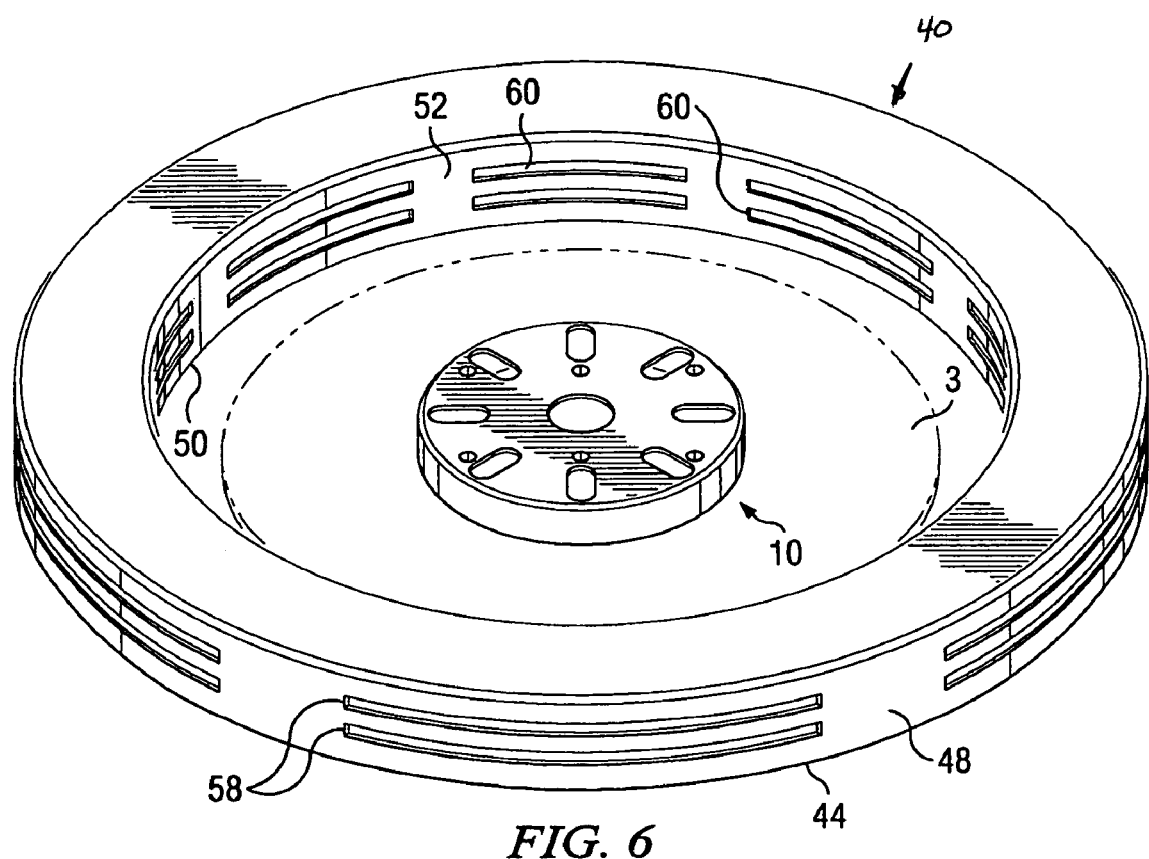
FIG. 6 is a top perspective view of the preferred embodiment of the shield of FIGS. 1–3B used in combination with the alternative embodiment of FIGS. 4 and 5.

The preferred embodiments of the invention may be used separately or in combination. For example, the either the disc shield 10 of FIGS. 1–3B or the annulus shield 40 of FIGS. 4 and 5 may be used alone or in combination as depicted in FIG. 6.

The methods and apparatus of the invention provide advantages including but not limited to shielding semiconductor tester load boards from electromagnetic interference and providing protection from potential physical damage. While the invention has been described with reference to certain illustrative embodiments, those described herein are not intended to be construed in a limiting sense. Various modifications and combinations of the illustrative embodiments as well as other advantages and embodiments of the invention will be apparent to persons skilled in the arts upon reference to the drawings, description, and claims.

I claim:

1. A tester load board shield comprising:
   an annulus for encircling a tester load board, the annulus having opposing planar surfaces;
   an outer rim extending from the outer edge of, and perpendicular to, the lower planar surface and defining the outer edge of the annulus;
   an inner rim extending from the inner edge of, and perpendicular to, the lower planar surface and defining the inner edge of the annulus;
   a plurality of ribs extending from, and perpendicular to, the lower planar surface, each rib radially connecting the inner rim to the outer rim; and
   one or more threaded fastener holes in at least two ribs, the fastener holes arranged for receiving fasteners for attachment of the annulus to a tester load board.

2. A tester load board shield according to claim 1 further comprising a plurality of ventilation slots perforating the outer rim.

3. A tester load board shield according to claim 1 further comprising a plurality of ventilation slots perforating the inner rim.

4. A tester load board shield according to claim 1 comprising a single piece of aluminum alloy.

5. A tester load board shield according to claim 1 further comprising four ribs equally spaced about the annulus.

6. A tester load board shield according to claim 1 further comprising two threaded fastener holes in each of the plurality of ribs.

* * * * *